(12) United States Patent
Wroblewski et al.

(10) Patent No.: US 12,232,433 B2
(45) Date of Patent: Feb. 18, 2025

(54) SEMICONDUCTOR DEVICE AND METHOD OF FORMING A SEMICONDUCTOR DEVICE

(71) Applicant: Infineon Technologies AG, Neubiberg (DE)

(72) Inventors: Artur Wroblewski, Munich (DE); Joel Hatsch, Holzkirchen (DE); Christoph Saas, Munich (DE); Stefan Seidl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 534 days.

(21) Appl. No.: 17/689,604

(22) Filed: Mar. 8, 2022

(65) Prior Publication Data

US 2022/0293852 A1  Sep. 15, 2022

(30) Foreign Application Priority Data

Mar. 9, 2021 (DE) .......................... 102021105680.2

(51) Int. Cl.
*H10N 70/00* (2023.01)
*H01L 49/02* (2006.01)
*H10B 63/00* (2023.01)

(52) U.S. Cl.
CPC ........... *H10N 70/826* (2023.02); *H01L 28/24* (2013.01); *H10B 63/00* (2023.02); *H10N 70/021* (2023.02); *H10N 70/8833* (2023.02)

(58) Field of Classification Search
CPC ................................ H10B 63/00; H10N 70/00
See application file for complete search history.

(56) References Cited

U.S. PATENT DOCUMENTS

2017/0207207 A1  7/2017  Hsiao et al.
2017/0330915 A1  11/2017  Chen

OTHER PUBLICATIONS

German Patent Office, Office Action issued for DE 102021105680. 2, 8 pgs., dated Oct. 15, 2021.

*Primary Examiner* — Marvin Payen
(74) *Attorney, Agent, or Firm* — Banner & Witcoff Ltd.

(57) ABSTRACT

A semiconductor device including a carrier having two main surfaces situated opposite one another, a circuit, having at least one resistance element, in and/or on the carrier, wherein the at least one resistance element has a longitudinal axis extending vertically between the main surfaces of the carrier, and a current limiting circuit configured to limit a current flowing through the resistance element to a value at which it is ensured that an electrical resistance of the resistance element remains substantially unchanged.

19 Claims, 8 Drawing Sheets

FIG. 1
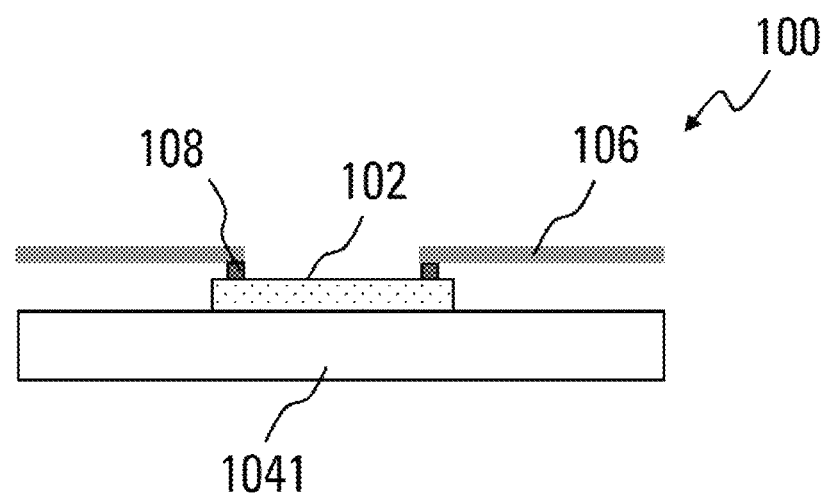
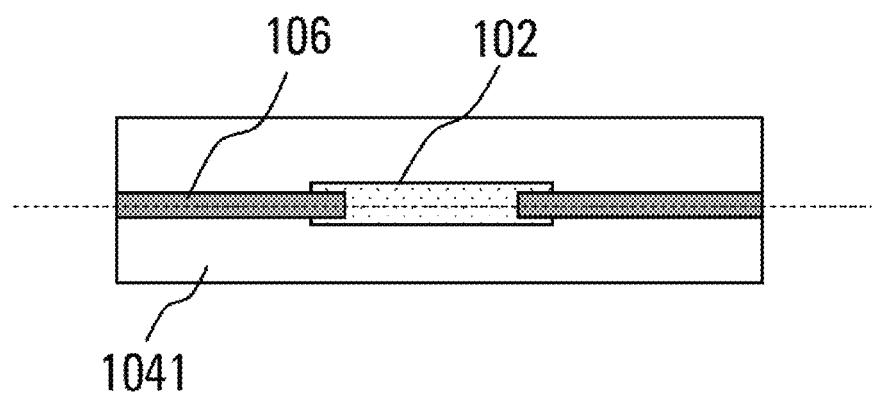

FIG. 3A
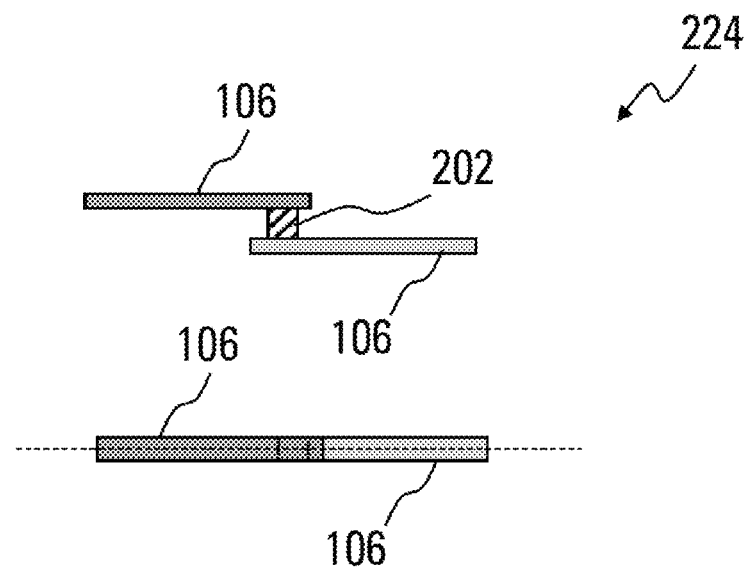
FIG. 3B
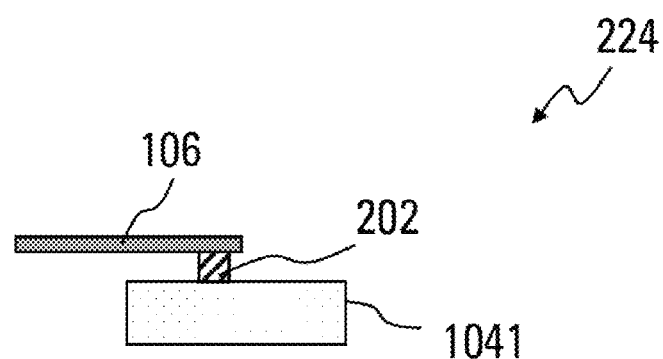
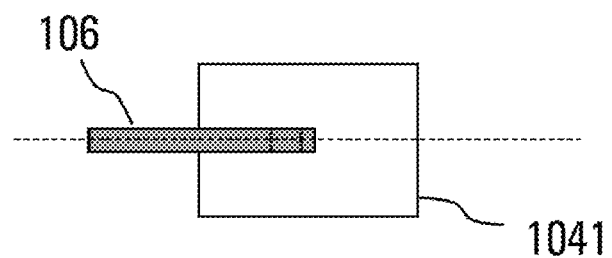

FIG. 4A | | FIG. 4B
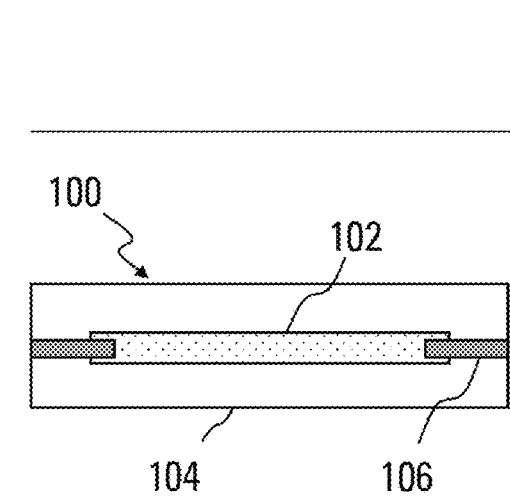 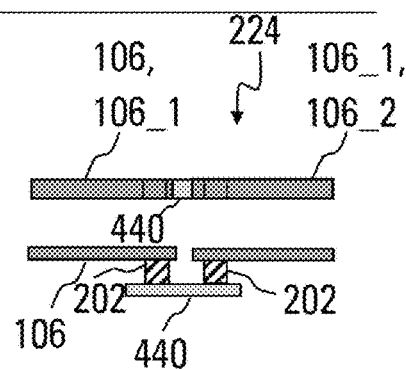 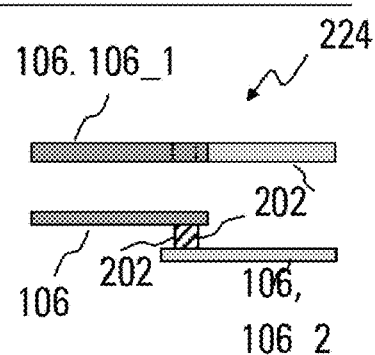 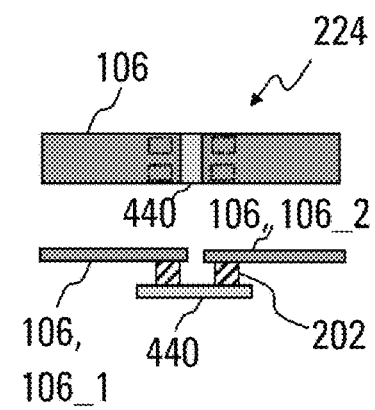

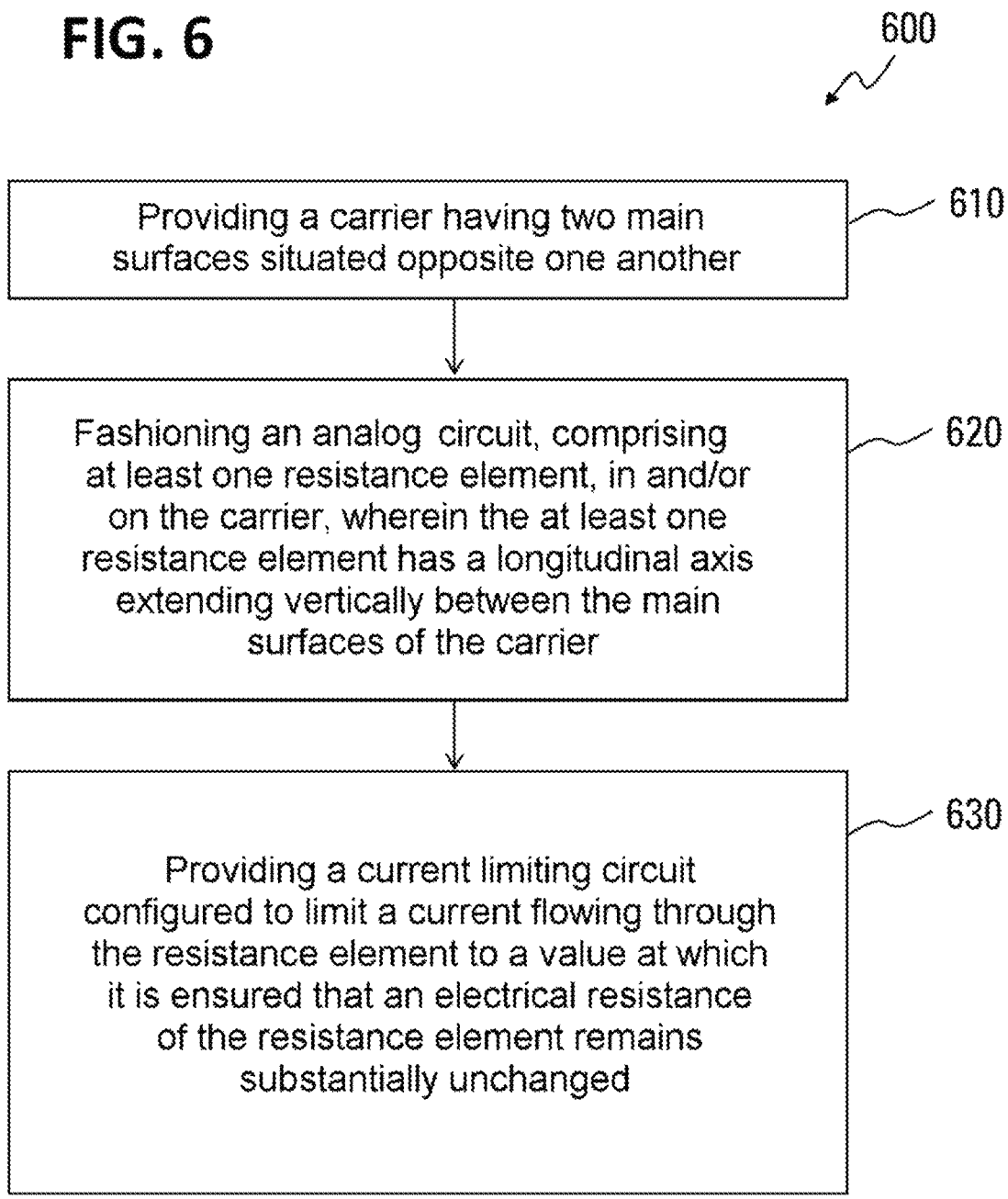

SEMICONDUCTOR DEVICE AND METHOD OF FORMING A SEMICONDUCTOR DEVICE

TECHNICAL FIELD

The disclosure relates to a semiconductor device and to a method for fashioning a semiconductor device.

BACKGROUND

Electrical resistors are one of the main components of electronic circuits. In integrated circuits, electrical resistors are used principally in analogue circuits, but they can be used for specific applications in digital circuits as well.

In integrated circuits, in many cases an area required for fashioning the resistors determines the total size of the (analog part of the) circuit.

This is because in most indicated devices the resistors are typically fashioned in a lateral direction, i.e. areally spread out parallel to main surfaces of the carrier, such that their size increases the size of the device which is intended to provide a specific functionality.

Physical dimensions of electrical resistors available for CMOS technologies, for example, almost do not scale at all as nodes become smaller. As a result, a proportion of the total circuit area that is constituted by the analog part of the circuit increases and thus largely determines the price of the integrated circuit and the circuit topology chosen.

An availability of electrical resistors having high resistance values and a small size (in particular semiconductor area) is essential for many analog applications, particularly if a low current consumption is intended to be achieved.

Accordingly, there is a need for electrical resistors which have a small area requirement in order to reduce the costs for semiconductor devices such as electronic analog circuits.

SUMMARY

In various exemplary embodiments, a semiconductor device is provided which comprises a resistance element which extends vertically and accordingly has a small area requirement.

In various exemplary embodiments (for example in the case of some CMOS technologies), during patterning processes that are carried out in accordance with convention, masks are reconfigured in order to embody the resistance element, such that the resistance element is producible without an additional mask process.

In various exemplary embodiments, the resistance element can be fashioned as part of the so-called frontend of line (FEOL) processing (e.g. within an (e.g. semiconductor) base material).

Alternatively, or additionally, in various exemplary embodiments, the resistance element can be fashioned as part of the so-called backend of line (BEOL) processing (e.g. directly before and/or between metallization processes).

The implementation of the resistance element as part of the BEOL processing, for example introduced into electrically insulating layers between metal layers or metal contacts, can be advantageous to the effect that the resistance element can be arranged above circuit elements fashioned during the FEOL processing, such that it is possible to realize the resistance element completely without additional (semiconductor) area consumption.

In various exemplary embodiments, the resistance element can be fashioned as an RRAM element (Resistive Random Access Memory Element).

By means of a current limiting circuit, in various exemplary embodiments, it can be ensured that the RRAM element has a substantially constant resistance value during operation of the semiconductor device.

BRIEF DESCRIPTION OF THE DRAWINGS

Exemplary embodiments of the invention are illustrated in the figures and are explained in greater detail below.
In the figures:

FIG. 1 shows a schematic cross-sectional view and plan view of parts of a semiconductor device with a resistance element in accordance with convention;

FIGS. 3A and 3B each show a schematic cross-sectional view and plan view of an analog circuit of a semiconductor device with a resistance element in accordance with various exemplary embodiments;

FIG. 4A shows schematic plan views of parts of semiconductor devices, in each case with a resistance element, in accordance with convention;

FIG. 4B shows schematic plan views of analog circuits of semiconductor devices, in each case with a resistance element, in accordance with various exemplary embodiments;

FIG. 6 shows a flow diagram of a method for fashioning a semiconductor device in accordance with various exemplary embodiments.

DETAILED DESCRIPTION

Figure 2:
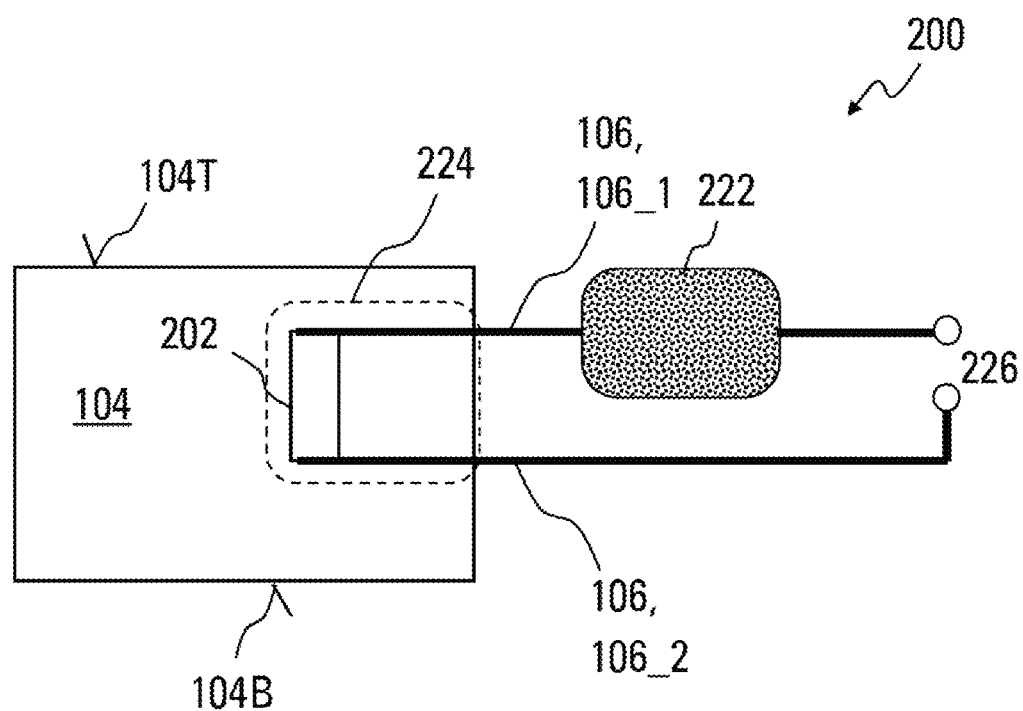
FIG. 2 shows a schematic illustration of a semiconductor device with a resistance element in accordance with various exemplary embodiments.
Figure 5A:
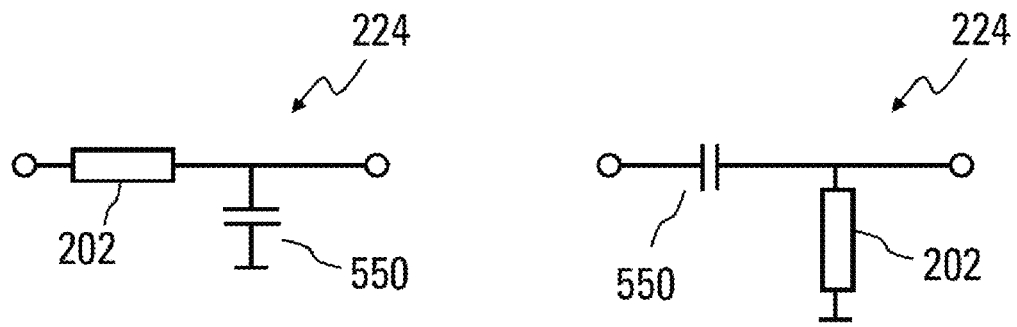
FIGS. 5A to 5I each show schematic illustrations of analog circuits of semiconductor devices in accordance with various exemplary embodiments.
Figure 5B:
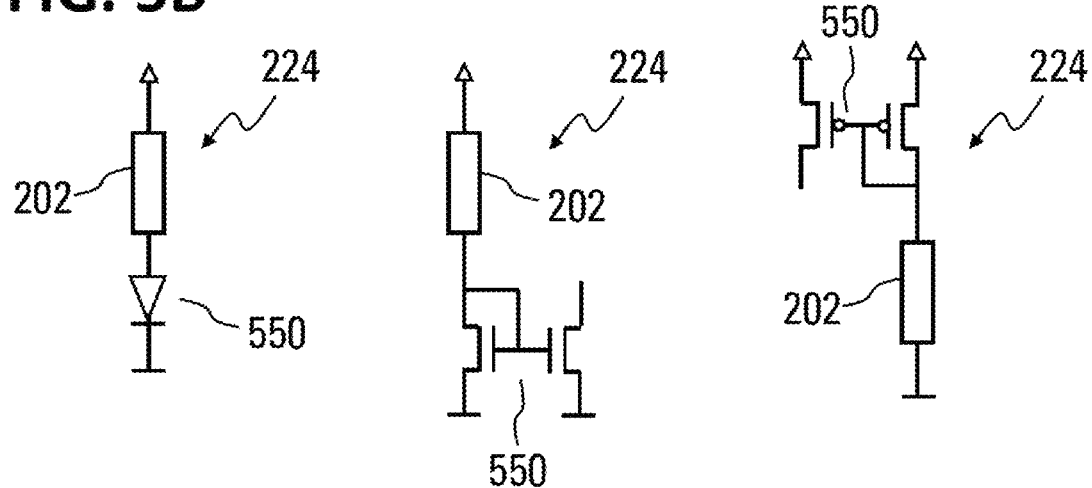
Figure 5C:
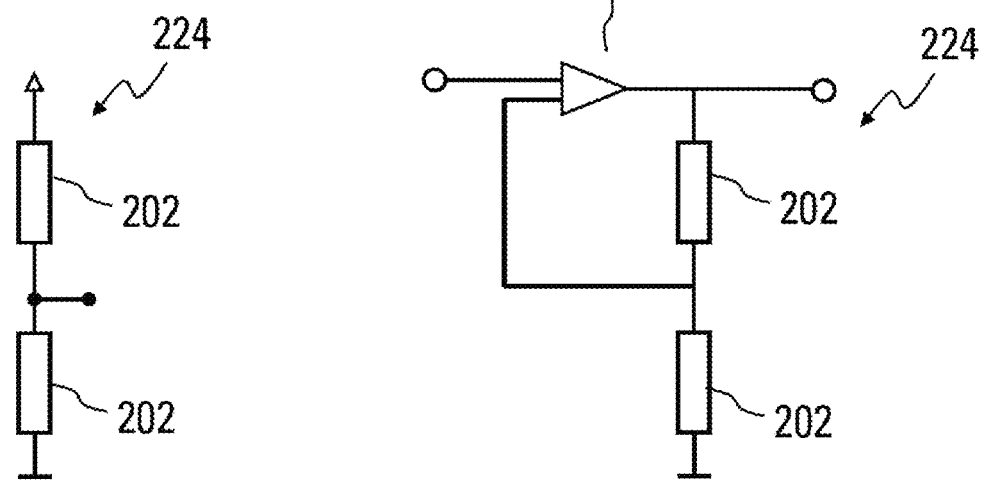
Figure 5D:
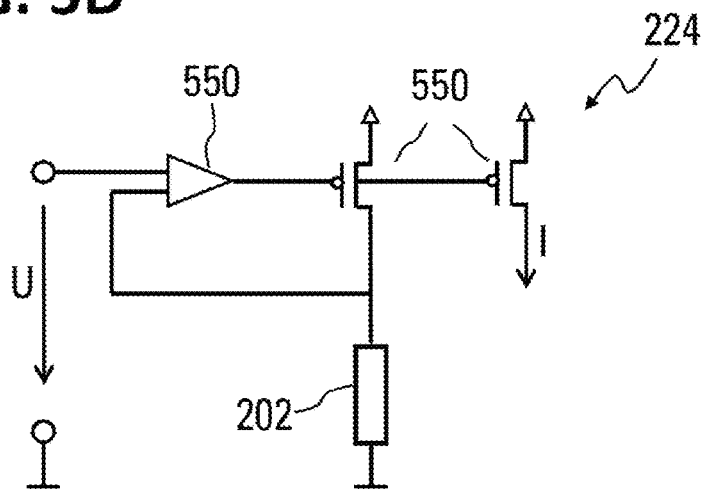
Figure 5E:
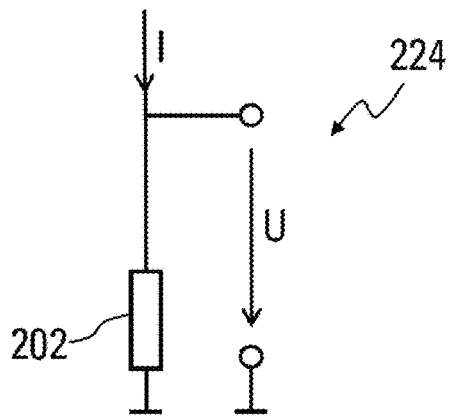
Figure 5F:
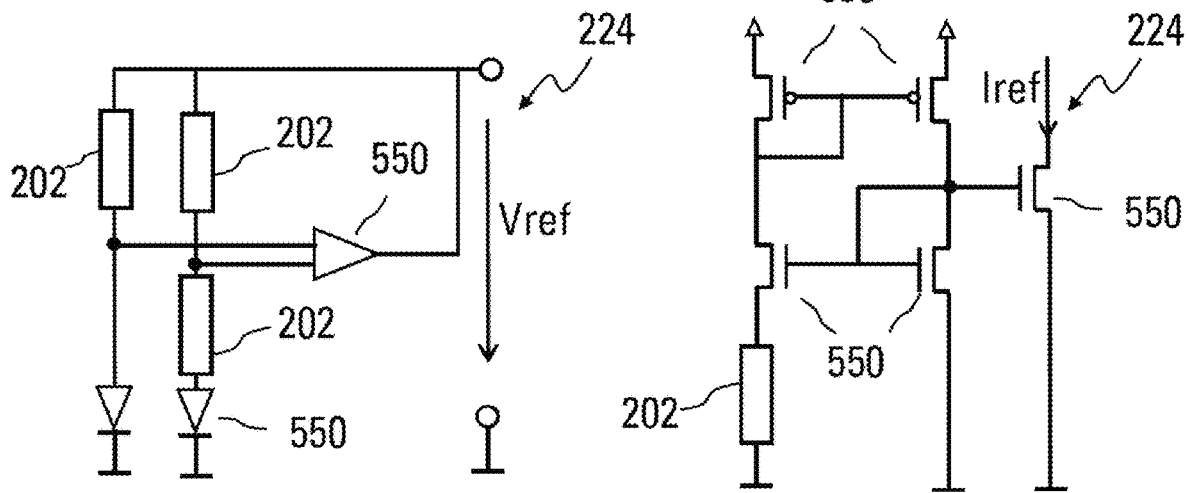
Figure 5G:
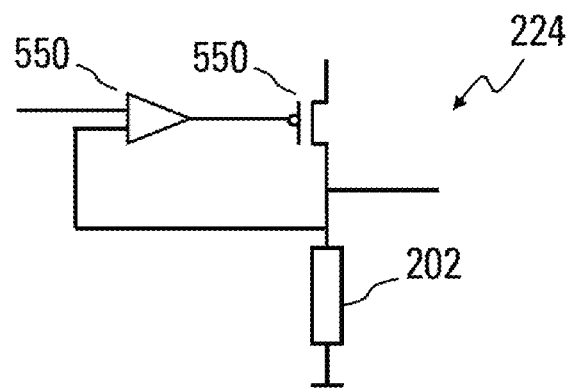
Figure 5H:
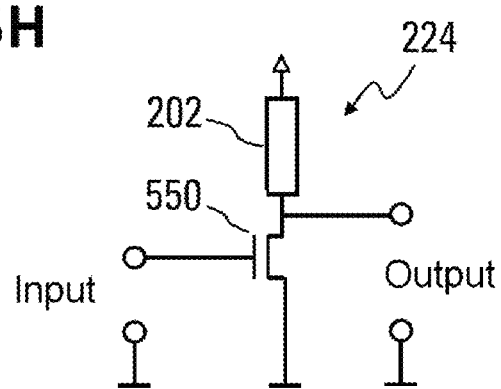
Figure 5I:
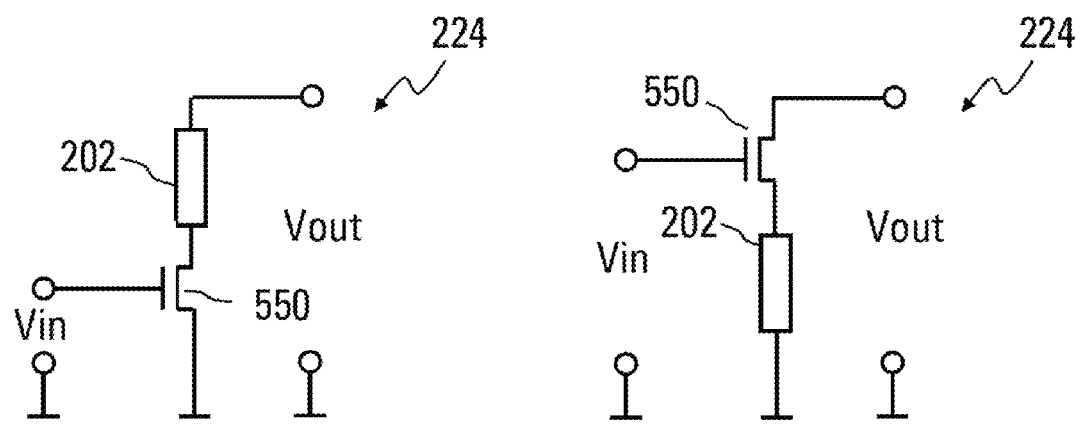

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected", "attached" and "coupled" are used to describe both a direct and an indirect connection, a direct or indirect attachment and a direct or indirect coupling. In the figures, identical or similar elements are provided with identical reference signs, insofar as this is expedient.

FIG. 1 shows a schematic cross-sectional view and plan view of parts of a semiconductor device 100 with a resistance element 102 in accordance with convention, and FIG.

4A shows schematic plan views of parts of semiconductor devices 100, in each case with a resistance element 102, in accordance with convention.

The semiconductor device 100 furthermore comprises lines 106 and connections 104 that electrically conductively connect the resistance element 102 to the lines 106.

In the case of the convention, e.g. in association with CMOS technologies, the resistance element 102 is typically embodied as lateral sheet resistance, e.g. as part of layers to be fashioned anyway during the FEOL processing, for example of diffusion and/or polysilicon layers, by masks being correspondingly adapted, if appropriate. With the use of so-called high-k dielectrics during gate production, for example a thin electrically conductive film (e.g. hafnium nitride) produced therefor can be used for the resistance element 102.

In that case, the electrical resistance is specified in the unit $\Omega/\square$. Since the resistance element 102 is typically fashioned so as to be as narrow as expediently possible anyway and the layer thickness is predefined by the layer to be used, that means that an area covered by the resistance element 102 increases linearly with the required resistance value, because the latter is variable only by way of a change in the length of the resistance element.

If a relatively high accuracy of the resistance value provided is furthermore intended to be achieved, even if fabrication tolerances and changes over the service life are included, that can mean that a width of the resistance element 102 is increased, and the accompanying reduction of resistance is in turn compensated for by a longer length.

This is illustrated in FIG. 4A, where the resistance element 102 shown in the middle has a resistance value of R, the resistance element 102 shown at the top has (with the same width and approximately double the length) approximately double the resistance value, and the resistance element 102 shown at the bottom has approximately the same resistance value as the one in the middle (approximately double the width, which is compensated for by approximately double the length), but with higher accuracy.

Typical resistance values striven for lie in a range of approximately 30 to approximately $1000\Omega/\square$ for polysilicon and approximately 10 to $100\Omega/\square$ for diffusion layers. Polysilicon is often preferred for the resistance element 102 because it has a high stability with regard to a voltage dependence of the resistance value and of the parasitic capacitances.

If a voltage dependence of the resistance value is not of concern, for example a doped well (for example n-doped) can also be used for fashioning the resistance element 102 (with e.g. approximately 1000 to $5000\Omega/\square$).

In the case of very price-conscious market applications, the high costs for resistance elements 102 having high resistance values can result in a circuit design being optimized to the effect that high resistances are avoided from the outset.

In various exemplary embodiments, a semiconductor device is provided which has a resistance element which extends in a vertical direction in relation to main surfaces of the semiconductor device.

FIG. 2 shows a schematic illustration of a semiconductor device 200 with a resistance element 202 in accordance with various exemplary embodiments, FIGS. 3A and 3B each show a schematic cross-sectional view and plan view of analog circuits 224 of a semiconductor device 200 with a resistance element 202 in accordance with various exemplary embodiments, FIG. 4B shows schematic plan views and cross-sectional views of analog circuits 224 of semiconductor devices 200, in each case with a resistance element 202, in accordance with various exemplary embodiments, and FIGS. 5A to 5I each show schematic illustrations of analog circuits 224 of semiconductor devices 200 in accordance with various exemplary embodiments.

In various exemplary embodiments, the semiconductor device 200 can comprise a carrier 104 having two main surfaces 104B, 104T situated opposite one another.

A carrier 104 is understood herein to mean a (for example blocklike) structure comprising layers arranged in and/or on at least one base material 104l. In this case, the at least one base material 104l and/or at least one of the layers comprise(s) a semiconductor material. The layers can comprise for example metallization layers, dielectric layers (electrically insulating layers) and/or additional semiconducting layers, which can be applied over the whole area or in patterned fashion.

In this case, the main surfaces 104B, 104T should be understood to mean those largest areas of the carrier 104 which result after one or more coating and/or patterning processes. During a coating process, for example, electrically conductive layers (e.g. metal layers), insulating layers and/or metallizations can be applied, which can optionally be patterned.

Components subsequently arranged directly on or over such an outermost (optionally patterned) layer (e.g. circuit elements such as e.g. capacitors, contact elements such as e.g. clips, packaging material, etc.) are not part of the carrier 104.

In various exemplary embodiments, the semiconductor device 200 can comprise an analog circuit 224, which can comprise at least one resistance element 202.

The analog circuit 224 can be fashioned in and/or on the carrier 104, wherein the at least one resistance element 202 has a longitudinal axis extending vertically between the main surfaces 104B, 104T of the carrier 104. To put it another way, the resistance element 202 can have its largest extent in a direction running from one of the main surfaces 104B or 104T to the other main surface 104T or 104B, respectively.

In various exemplary embodiments, any arbitrary electrically conductive material having a high resistivity can be used as material of the resistance element 202. Preferably, materials can be used which are arrangeable in vias and/or are patternable by means of masks. By way of example, a via filled with a material whose specific electrical conductivity is so low that it is almost already nonconducting can form an electrical resistance having a very high resistance value.

In various exemplary embodiments, the patterning process in which the resistance element 202 is fashioned can be an FEOL and/or a BEOL patterning process which is carried out anyway, and in which for example the mask is correspondingly adapted. In various exemplary embodiments, at least one type of structure can correspond to other structures fashioned in the semiconductor device 200 and/or a material used for the resistance element 202 can correspond to other materials used in the semiconductor device 200, in order that a process complexity is not increased or is only slightly increased. By way of example, the via described above can be fashioned together with other vias and can be filled with the almost nonconducting material.

FIG. 2 illustrates the entire carrier 104 in cross section with the two main surfaces 104B and 104l thereof (which, in various exemplary embodiments, can be fashioned in a patterned manner instead of in a planar manner as in FIG. 2), and the resistance element is fashioned between the two main surfaces 104B, 104T.

In various exemplary embodiments, an upper end of the resistance element 202 can be electrically conductively connected to a line 106, 106_1, and a lower end of the resistance element 202 can be electrically conductively connected to another line 106, 106_2. In various exemplary embodiments, the line 106_1 can be part of a first metallization layer of the semiconductor device 200, and the other line 106_2 can be part of another metallization layer of the semiconductor device 200.

That is also illustrated by way of example in FIG. 3A and in FIG. 4B, in the middle.

In various exemplary embodiments, an upper end of the resistance element 202 can be electrically conductively connected to a line 106, 106_1, and a lower end of the resistance element 202 can be electrically conductively connected to the base material 1041 of the carrier 104. In that case, the base material 1041 can be electrically conductive or semiconducting. One such exemplary embodiment is illustrated in FIG. 3B.

The resistance element 202 can be laterally surrounded by dielectric material. The resistance element 202 can be in direct contact with the dielectric material laterally. Semiconductor material or electrically conductive material can be arranged on a side of the dielectric material facing away from the resistance element 202.

In various exemplary embodiments, the at least one resistance element can be situated within the base material 1041 of the carrier 104, and/or within a layer structure arranged on the base material 1041.

In various exemplary embodiments, the analog circuit 224 can comprise at least one additional circuit element 550. That is explained more thoroughly below in association with FIGS. 5A to 5I.

In various exemplary embodiments, for example if an RRAM memory is fashioned in the semiconductor device 200 (or even without that being the case), the resistance element can be fashioned substantially like a resistance element of such an RRAM memory. The RRAM resistance element can be fashioned from a material which, directly after being arranged, has a very high resistance or can even be a dielectric. The RRAM resistance element can be made conductive by means of at least one conduction path fashioned after a sufficiently high voltage has been applied. The fashioning of the conduction path is also referred to as forming or forming operation, the voltage required therefor is accordingly referred to as forming voltage, and the resulting current as forming current. The fashioning of the conduction path can arise from various mechanisms, including defects, metal migration and/or other mechanisms. Suitable materials for the RRAM memory cell (and accordingly also for the resistance element 202) are for example hafnium oxide, zirconium oxide, aluminum oxide, nickel oxide, tantalum oxide and/or titanium oxide.

After forming, the RRAM memory cell can be reset, i.e. interrupted, by means of a suitably applied voltage, which results in a high resistance, or can be set, i.e. re-established, which results in a low resistance.

In the case of the resistance element 202 in accordance with various exemplary embodiments, one of the four possible states of an RRAM memory cell can be established after the process of arranging the resistance element material. Either the unformed state (which can have a resistance value of a plurality of MΩ), or, as a result of a suitable voltage or a suitable current being provided, one of the three states of formed (low resistance), reset (high resistance) and set (lower resistance than in the reset state, but higher than in the formed state; the resistance can be for example in a range around 20 kW. Afterward, the semiconductor device 200 can be configured such that the resistance value of the resistance element 202 is prevented from subsequently being switched over.

In various exemplary embodiments, the semiconductor device 200 can comprise a current limiting circuit 222, which can be configured to limit a current flowing through the resistance element 202 on account of a voltage provided at voltage supply connections 226 to a value at which it is ensured that an electrical resistance of the resistance element 202 remains substantially unchanged. Accordingly, the current can be limited so as to prevent switching from the unformed state into the formed state and/or switching over between the formed state, the reset state and the set state.

A use of the unformed resistance element 202 can be advantageous to the effect that the current limiting circuit 222 can be immediately jointly fashioned with and connected to the analog circuit 224 because a high current (and accordingly also a corresponding circuit) is not required for forming the resistance element 202. Furthermore, very high resistance values can be achieved.

Accordingly, in various exemplary embodiments, the resistance element 202 is not usable as an RRAM memory cell.

A voltage limiting circuit can be provided instead of the current limiting circuit 222 with substantially the same effect.

In various exemplary embodiments, the current limiting circuit 222 (or the voltage limiting circuit) can be fashioned on and/or in the carrier 200, or can be fashioned outside the carrier 200.

In FIGS. 3A and 3B, FIG. 4B and FIGS. 5A to 5I, the current limiting circuit 222 and the carrier 104 are omitted for the sake of clarity, rather the illustration shows in each case only the analog circuit 224 or parts thereof.

In various exemplary embodiments, the resistance element 202 fashioned like an RRAM memory cell can have a small lateral extent (for example approximately double the magnitude of a contact), and can thus have a high resistance value. In order to enable finely graduated resistance values across a wide range of resistance values in a cost-effective manner, a plurality of the resistance elements 202 can be connected in parallel and/or in series. In various exemplary embodiments, one or more resistance elements 202 can be added (supplementarily connected) to the analogue circuit 224 or can be removed from the latter (disconnected by means of a switch).

Resistance elements 202 connected in parallel can be advantageous to the effect that fluctuations or tolerances in the resistance value, which can be caused by process fluctuations, for example, can be compensated for, and/or in order to enable a significant current intensity despite a high resistance of each individual resistance element 202.

FIG. 4B shows in the top and bottom illustrations by way of example how a series connection of two or more resistance elements 202 can be fashioned. For this purpose, a first of the resistance elements 202, at one end (for example the upper end), can be electrically conductively connected to the first line 106_1, and a second of the resistance elements 202, at the same end (for example likewise the upper end), can be electrically conductively connected to the second line 106_2. The two other ends can be connected to one another by means of a connecting section 440. The connecting section can be for example part of a metallization layer, for example of a different metallization layer than the first line 106_1 and the second line 106_2, which can be part of the same metallization layer in this exemplary embodiment.

For a parallel connection of two or more resistance elements 202, the first line 106_1 can be electrically conductively connected to the upper ends of the two or more resistance elements 202, and the second line can be electrically conductively connected to the same two or more resistance elements 202 at their lower ends. In a plan view, the resistance elements 202 connected in parallel can be arranged next to one another or one behind another in order to be connected to the first line 106_1 and respectively the second line 106_2.

In FIG. 4B, in a manner similar to that in the case of the conventional example from FIG. 4A, there are in the middle a resistance element 202 having a resistance R, at the top a realization of a resistance with approximately double the magnitude (as a series connection of two resistance elements 202) and at the bottom a realization of a resistance exactly equal in magnitude to that in the middle, but with higher accuracy with regard to the resistance value (by virtue of the fact that a combination of parallel and series connection of a total of four resistance elements 202 is used, such that, as viewed illustratively, a mean value of the resistance values of these four resistance elements 202 is used, such that tolerances are compensated for in comparison with the single element used in the middle analogue circuit).

The lines 106 that can be fashioned as contact layers for the at least one resistance element 202 can comprise for example the third and fourth metal layers, or some other combination of the metal layers of the semiconductor device 200.

When fashioning the resistance element 202 as part of the BEOL processing, it is possible for the resistance element 202 to be fashioned above circuit elements (which can comprise at least partly the additional circuit elements 550) during the FEOL fabrication, such that the resistance element 202 can be fashioned without or almost without an additional space requirement.

The at least one resistance element 202 can be used as part of the analog circuit 224 in order to provide a function.

The analog circuit 224 can constitute for example a filter (see FIG. 5A), a bias voltage generator (FIG. 5B), a voltage divider (FIG. 5C), a voltage-current converter (FIG. 5D), a current-voltage converter (FIG. 5E), a reference voltage source (FIG. 5F on the left, for example for a reference signal connection BGP), a reference current source (FIG. 5F on the right), a load (FIG. 5G), an inverter (FIG. 5H), a current limiter (FIG. 5I), a noninverting amplifier, a summing amplifier, a subtracting amplifier, an integrator and/or a differentiator.

The additional circuit elements 550 used therefor are recognizable on the basis of their circuit symbols in FIGS. 5A to 5I and, apart from the configuration of the at least one resistance element 202, can be fashioned substantially as known conventionally.

The additional circuit elements 550 can comprise for example capacitors, diodes, transistors, operational amplifiers and the like.

FIG. 6 shows a flow diagram of a method for fashioning a semiconductor device in accordance with various exemplary embodiments.

The method comprises providing a carrier having two main surfaces situated opposite one another (at 610), fashioning an analog circuit, comprising at least one resistance element, in and/or on the carrier, wherein the at least one resistance element has a longitudinal axis extending vertically between the main surfaces of the carrier (at 620), and providing a current limiting circuit configured to limit a current flowing through the resistance element to a value at which it is ensured that an electrical resistance of the resistance element remains substantially unchanged (at 630).

Some exemplary embodiments are specified in summary below.

Exemplary embodiment 1 is a semiconductor device. The semiconductor device comprises a carrier having two main surfaces situated opposite one another, an analog circuit, comprising at least one resistance element, in and/or on the carrier, wherein the at least one resistance element has a longitudinal axis extending vertically between the main surfaces of the carrier, and a current limiting circuit configured to limit a current flowing through the resistance element to a value at which it is ensured that an electrical resistance of the resistance element remains substantially unchanged.

Exemplary embodiment 2 is a semiconductor device in accordance with exemplary embodiment 1, wherein the at least one resistance element is fashioned as an RRAM element.

Exemplary embodiment 3 is a semiconductor device in accordance with exemplary embodiment 2, wherein the RRAM element is in an unformed state, in a formed high-resistance state or in a formed low-resistance state.

Exemplary embodiment 4 is a semiconductor device in accordance with any of exemplary embodiments 1 to 3, wherein the at least one resistance element comprises two or more resistance elements connected or connectable in parallel.

Exemplary embodiment 5 is a semiconductor device in accordance with any of exemplary embodiments 1 to 4, wherein the at least one resistance element comprises two or more resistance elements connected or connectable in series.

Exemplary embodiment 6 is a semiconductor device in accordance with any of exemplary embodiments 1 to 5, wherein the resistance of the resistance element is in a range of between 1 k$\Omega$ and 100 M$\Omega$, optionally between 1 M$\Omega$ and 100 M$\Omega$.

Exemplary embodiment 7 is a semiconductor device in accordance with any of exemplary embodiments 1 to 6, wherein the analog circuit comprises at least one additional circuit element.

Exemplary embodiment 8 is a semiconductor device in accordance with exemplary embodiment 7, wherein the at least one additional circuit element comprises at least one from a group of circuit elements, the group comprising a capacitor, a diode, a transistor, and an operational amplifier.

Exemplary embodiment 9 is a semiconductor device in accordance with any of exemplary embodiments 1 to 8, wherein the analog circuit is fashioned as one from a group of analog circuits, the group comprising a filter, a voltage divider, a bias voltage generator, a voltage-current converter, a current-voltage converter, a reference voltage source, a reference current source, a load, an inverter, a current limiter, a noninverting amplifier, a summing amplifier, a subtracting amplifier, an integrator, and a differentiator.

Exemplary embodiment 10 is a semiconductor device in accordance with any of exemplary embodiments 1 to 9, wherein the at least one resistance element is fashioned in a frontend insulating layer.

Exemplary embodiment 11 is a semiconductor device in accordance with any of exemplary embodiments 1 to 9, wherein the at least one resistance element is fashioned in a backend insulating layer.

Exemplary embodiment 12 is a semiconductor device in accordance with any of exemplary embodiments 1 to 11, wherein the circuit is an analog circuit.

Exemplary embodiment 13 is a semiconductor device in accordance with any of exemplary embodiments 1 to 12, wherein a main current flow passes along the vertical longitudinal axis.

Exemplary embodiment 14 is a method for fashioning a semiconductor device, wherein the method comprises providing a carrier having two main surfaces situated opposite one another, fashioning an analog circuit, comprising at least one resistance element, in and/or on the carrier, wherein the at least one resistance element has a longitudinal axis extending vertically between the main surfaces of the carrier, and providing a current limiting circuit configured to limit a current flowing through the resistance element to a value at which it is ensured that an electrical resistance of the resistance element remains substantially unchanged.

Exemplary embodiment 15 is a method in accordance with exemplary embodiment 14, wherein the fashioning of the resistance element is effected as part of the frontend processing.

Exemplary embodiment 16 is a method in accordance with exemplary embodiment 14, wherein the fashioning of the resistance element is effected as part of the backend processing.

Exemplary embodiment 17 is a method in accordance with any of exemplary embodiments 14 to 16, wherein the at least one resistance element is fashioned as an RRAM element.

Exemplary embodiment 18 is method in accordance with exemplary embodiment 17, wherein the RRAM element is in an unformed state.

Exemplary embodiment 19 is a method in accordance with exemplary embodiment 17, which furthermore comprises forming the RRAM element into a high-resistance state or into a low-resistance state, wherein providing the current limiting circuit is effected after forming the RRAM element.

Further advantageous configurations of the device are evident from the description of the method, and vice versa.

The invention claimed is:

1. A semiconductor device, comprising:
   a carrier having two main surfaces situated opposite one another;
   a circuit, comprising at least one resistance element, in and/or on the carrier, wherein the at least one resistance element has a longitudinal axis extending vertically between the main surfaces of the carrier; and
   a current limiting circuit configured to limit a current flowing through the resistance element to a value at which it is ensured that an electrical resistance of the resistance element remains substantially unchanged.

2. The semiconductor device as claimed in claim 1, wherein the at least one resistance element is formed as an RRAM element.

3. The semiconductor device as claimed in claim 2, wherein the RRAM element is in an unformed state, in a formed high-resistance state or in a formed low-resistance state.

4. The semiconductor device as claimed in claim 1, wherein the at least one resistance element comprises two or more resistance elements connected or connectable in parallel.

5. The semiconductor device as claimed in claim 1, wherein the at least one resistance element comprises two or more resistance elements connected or connectable in series.

6. The semiconductor device as claimed in claim 1, wherein the resistance of the resistance element is in a range of between 1 kΩ and 100 MΩ.

7. The semiconductor device as claimed in claim 1, wherein the analog circuit comprises at least one additional circuit element.

8. The semiconductor device as claimed in claim 7, wherein the at least one additional circuit element comprises at least one circuit element selected from a group of circuit elements consisting of:
   a capacitor;
   a diode;
   a transistor; and
   an operational amplifier.

9. The semiconductor device as claimed in claim 1, wherein the circuit is formed as an analog circuit element selected from a group of analog circuits consisting of:
   a filter;
   a voltage divider;
   a bias voltage generator;
   a voltage-current converter;
   a current-voltage converter;
   a reference voltage source;
   a reference current source;
   a load;
   an inverter;
   a current limiter;
   a noninverting amplifier;
   a summing amplifier;
   a subtracting amplifier;
   an integrator; and
   a differentiator.

10. The semiconductor device as claimed in claim 1, wherein the at least one resistance element is formed in a frontend insulating layer.

11. The semiconductor device as claimed in claim 1, wherein the at least one resistance element is formed in a backend insulating layer.

12. The semiconductor device as claimed in claim 1, wherein the circuit is an analog circuit.

13. The semiconductor device as claimed in claim 1, wherein a main current flow passes along the vertical longitudinal axis.

14. A method for forming a semiconductor device, the method comprising:
   providing a carrier having two main surfaces situated opposite one another;
   forming a circuit, comprising at least one resistance element, in and/or on the carrier, wherein the at least one resistance element has a longitudinal axis extending vertically between the main surfaces of the carrier; and
   providing a current limiting circuit configured to limit a current flowing through the resistance element to a value at which it is ensured that an electrical resistance of the resistance element remains substantially unchanged.

15. The method as claimed in claim 14, wherein the resistance element is formed as part of frontend processing.

16. The method as claimed in claim 14, wherein the resistance element is formed as part of backend processing.

17. The method as claimed in claim 14, wherein the at least one resistance element is formed as an RRAM element.

18. The method as claimed in claim 17, wherein the RRAM element is in an unformed state.

19. The method as claimed in claim 17, furthermore comprising:
   forming the RRAM element into a high-resistance state or into a low-resistance state;

wherein the current limiting circuit is provided after forming the RRAM element.

* * * * *